(12) United States Patent
Sugiura et al.

(10) Patent No.: US 7,744,379 B2
(45) Date of Patent: Jun. 29, 2010

(54) ELECTRIC CONNECTION BOX

(75) Inventors: Tomohiro Sugiura, Kakegawa (JP);
Keisuke Ozawa, Kakegawa (JP);
Katsuhiro Kubota, Kakegawa (JP);
Katsuyoshi Kobayashi, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 12/360,877

(22) Filed: Jan. 28, 2009

(65) Prior Publication Data
US 2009/0197477 A1    Aug. 6, 2009

(30) Foreign Application Priority Data
Jan. 29, 2008    (JP) .............................. 2008-018151

(51) Int. Cl.
*H01R 12/00* (2006.01)
(52) U.S. Cl. .................................................... 439/76.2
(58) Field of Classification Search ................ 439/76.1, 439/76.2, 79, 80
See application file for complete search history.

(56) References Cited

U.S. PATENT DOCUMENTS

| | | | | |
|---|---|---|---|---|
| 4,820,179 | A * | 4/1989 | Saijo ........................... | 439/224 |
| 5,655,927 | A * | 8/1997 | Maue et al. .................. | 439/510 |
| 7,566,230 | B2 * | 7/2009 | Ozawa et al. ............... | 439/76.2 |
| 2005/0231896 | A1 | 10/2005 | Yamashita | |
| 2008/0061920 | A1 * | 3/2008 | Kubota ........................ | 337/198 |
| 2009/0191728 | A1 * | 7/2009 | Kubota et al. .............. | 439/76.2 |

FOREIGN PATENT DOCUMENTS

| | | |
|---|---|---|
| JP | 2005-185018 A | 7/2005 |
| JP | 2005-312129 A | 11/2005 |
| JP | 2006-149069 A | 6/2006 |

* cited by examiner

*Primary Examiner*—Neil Abrams
*Assistant Examiner*—Phuong Nguyen
(74) *Attorney, Agent, or Firm*—Sughrue Mion, PLLC

(57) ABSTRACT

The present invention provides an electric connection box capable of carrying out insertion accurately when a plurality of connection terminals provided at a terminal holding member to a plurality of inserting grooves of a terminal inserting member, as a result, capable of preventing deformation of the connection terminal. The electric connection box of the invention includes a terminal holding member having a front surface, a first side surface, and a second side surface and including a plurality of terminals mounted on the front surface so as to be projected from the front surface, an source terminal mounted on the first side surface so as to be projected from the first side surface in a direction in which the terminals align, a guide projected streak mounted on the second side surface along a direction in which the terminals are projected so as to be projected from the second side surface, and a terminal inserting member including a plurality of inserting grooves in which the terminals are inserted, a terminal guide groove in which the source terminal is inserted, and a streak guide groove in which the guide projected streak is inserted.

3 Claims, 9 Drawing Sheets

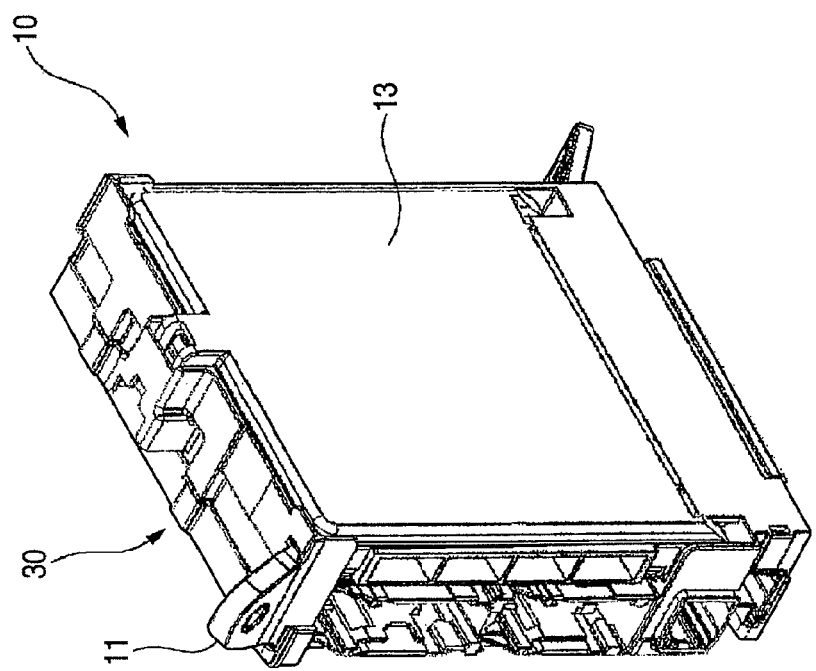
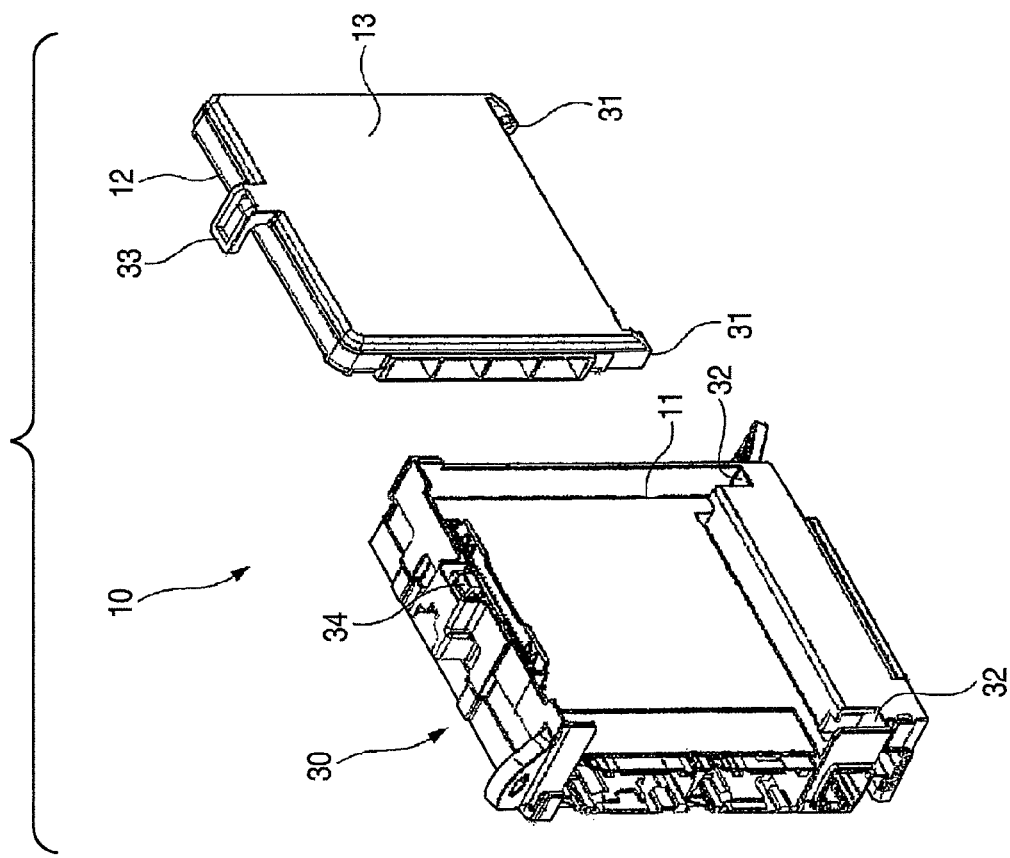
FIG. 2A
FIG. 2B

ELECTRIC CONNECTION BOX

BACKGROUND OF THE INVENTION

The present invention relates to an electric connection box (that is, electric junction block) of, for example, a relay box, a fuse box, an electronic control unit box or the like used as a power distribution apparatus mounted with an electric part and electrically connected to a battery and various electric loads by way of a wire harness on a vehicle of an automobile or the like.

An electric connection box mounted with an electric part and connected with a wire harness to electrically conduct to the electric part is introduced in JP-A-2006-149069 and JP-A-2005-185018. In such an electric connection box, a technology of facilitating to assemble parts is applied. Meanwhile, an electric connection box of attaching a terminal inserting member formed with a plurality of inserting grooves for inserting connection terminals to a terminal holding member projected with a plurality of the connection terminals is introduced in JP-A-2005-312129.

There is a case in which when the plurality of connection terminals provided at the terminal holding member are inserted to the plurality of inserting grooves of the terminal inserting member described above, unless insertion is carried out accurately, the connection terminal is deformed.

SUMMARY OF THE INVENTION

The invention has been carried out in view of the above-described situation and it is an object of the invention to provide an electric connection box capable of carrying out insertion accurately when a plurality of connection terminals provided at a terminal holding member are inserted to a plurality of inserting grooves of a terminal inserting member, as a result, capable of preventing a deformation of the connection terminal.

In order to achieve the above-described object, an electric connection box according to the invention is conceived. The first aspect of the invention is an electric connection box including a terminal holding member having a front surface, a first side surface, and a second side surface. The electric connection box also includes a plurality of terminals mounted on the front surface so as to be projected from the front surface, an source terminal mounted on the first side surface so as to be projected from the first side surface in a direction in which the terminals align, a guide projected streak mounted on the second side surface along a direction in which the terminals are projected so as to be projected from the second side surface, and a terminal inserting member including a plurality of inserting grooves in which the terminals are inserted, a terminal guide groove in which the source terminal is inserted, and a streak guide groove in which the guide projected streak is inserted.

The second aspect of the invention is that a width of the front end portion of the guide projected streak is larger than the width of the bottom portion of the guide projected streak; and the terminal inserting member includes a guide portion with plate shape on which the streak guide groove is formed.

The third aspect of the invention is that the terminals are connected with a fuse.

According to the electric connection box of the first aspect, when the plurality of connection terminals of the terminal holding member are inserted to the plurality of inserting grooves of the terminal inserting member, the power source terminal at the one side portion of the terminal holding can be guided by the terminal guide groove of the terminal inserting member and the guide projected streak at the other side portion of the terminal holding member can be guided by the streak guide groove of the terminal inserting member. Thereby, the plurality of connection terminals of the terminal holding member can be inserted to the plurality of inserting grooves of the terminal inserting member while being positioned, as a result, a deformation of the connection terminal can be prevented.

According to the electric connection box of the second aspect, when the guide projected streak at the other side portion of the terminal holding member is guided by the streak guide groove of the terminal inserting member, the plate-like member of the terminal inserting member is inserted to between the other side portion of the terminal holding member and the wide width portion on the front end portion of the guide projected streak. Thereby, the plurality of connection terminals of the terminal holding member can be inserted to the plurality of inserting grooves of the terminal inserting member while being further accurately positioned, as a result, the deformation of the connection terminal can firmly be prevented.

According to the electric connection box of the third aspect, the connection terminal is connected with the fuse, and therefore, a failure in connecting the fuse can be prevented by preventing the deformation of the connection terminal.

According to the invention, when the plurality of connection terminals provided at the terminal holding member are inserted to the plurality of inserting grooves, insertion can accurately be carried out, as a result, the deformation of the connection terminal can be prevented.

A concise explanation has been given of the invention as described above. Further, details of the invention may further be made clear by reading the best mode for carrying out the invention explained below in reference to attached drawings.

BRIEF DESCRIPTION OF DRAWINGS

FIGS. 2A and 2B show before and after assembling an electronic control unit of the electric connection box. FIG. 2A is a perspective view before being assembled;

FIG. 2B is a perspective view after having been assembled.

FIG. 3A is a flat sectional view, FIG. 3B is a front view, FIG. 3C is a bottom view, FIG. 3D is a side view.

FIG. 4A is a rear view; FIG. 4B is a side view.

FIG. 6A is a plane view; FIG. 6B is a front view; FIG. 6C is a sectional view taken along a line A-A of FIG. 6A.

FIG. 7A is a perspective view before being assembled; FIG. 7B is a perspective view in the midst of being assembled.

FIG. 8A is a perspective view before being assembled; FIG. 8B is a perspective view after having been assembled.

PREFERRED EMBODIMENT OF THE INVENTION

An electric connection box according to an embodiment of the invention will be explained in reference to the drawings as follows.

Figure 1:
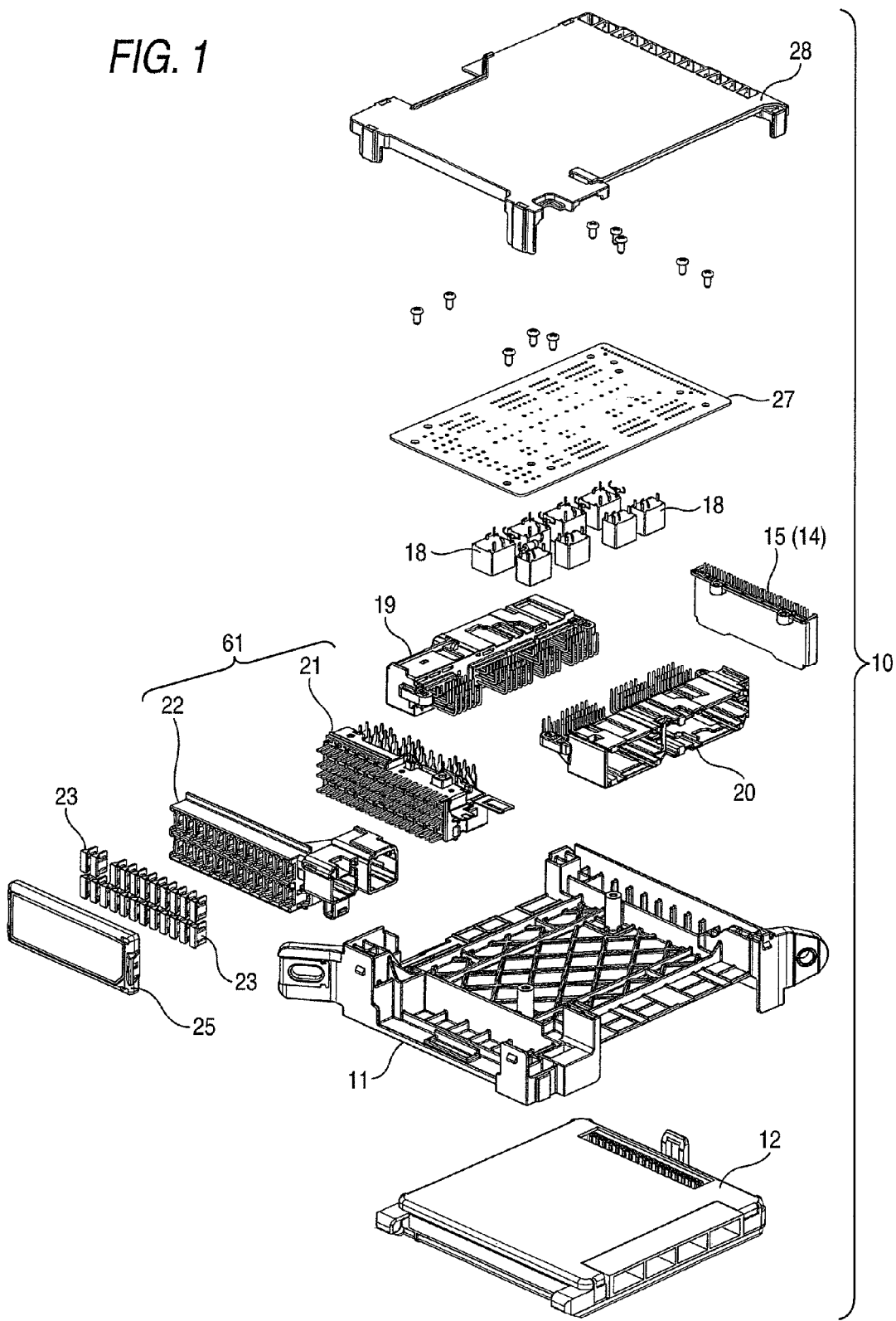
FIG. 1 is a disassembled perspective view showing a structure of an electric connection box according to the embodiment.
Figure 3A:
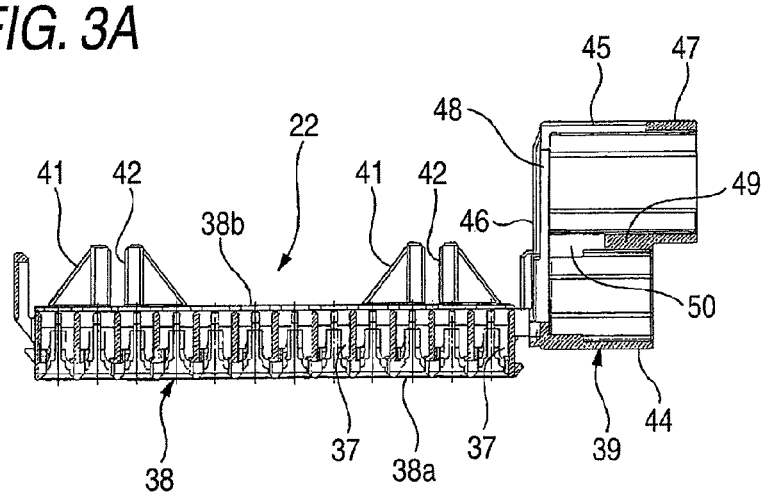
FIGS. 3A, 3B,3C, and 3D show a fuse connection box.
Figures 3B, 3D:
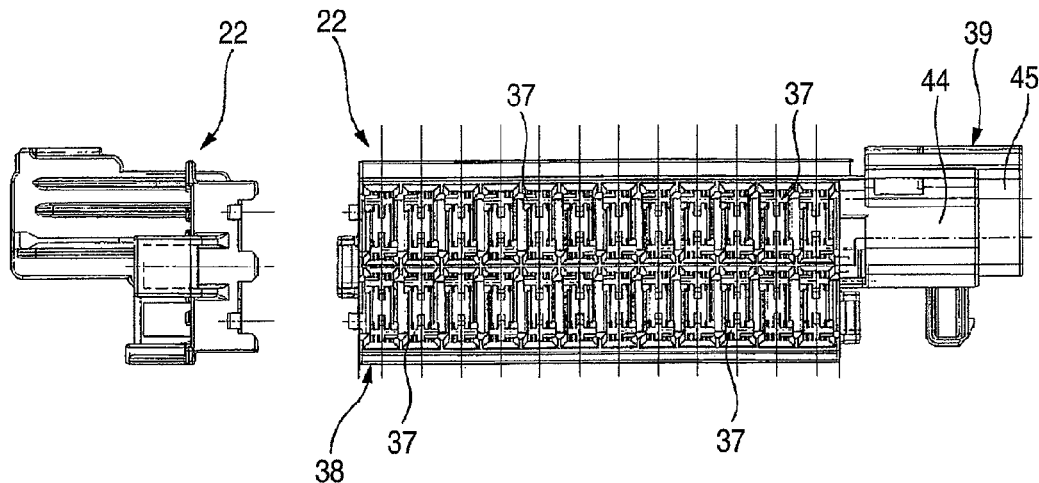
Figure 3C:
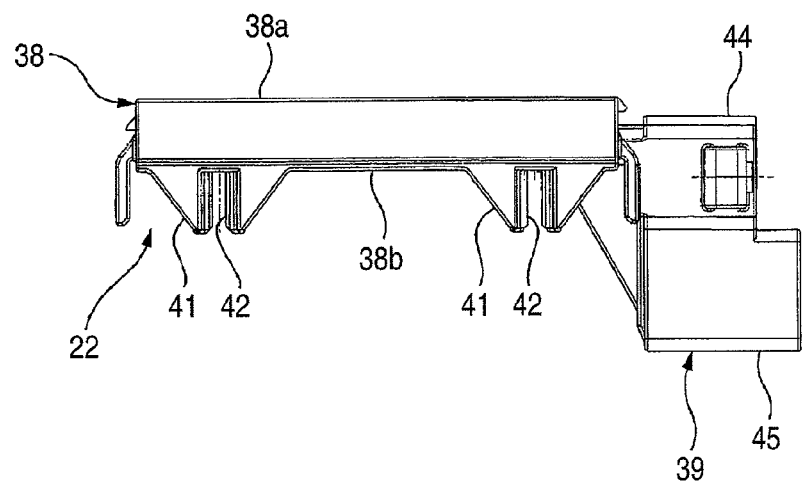
Figure 4A:
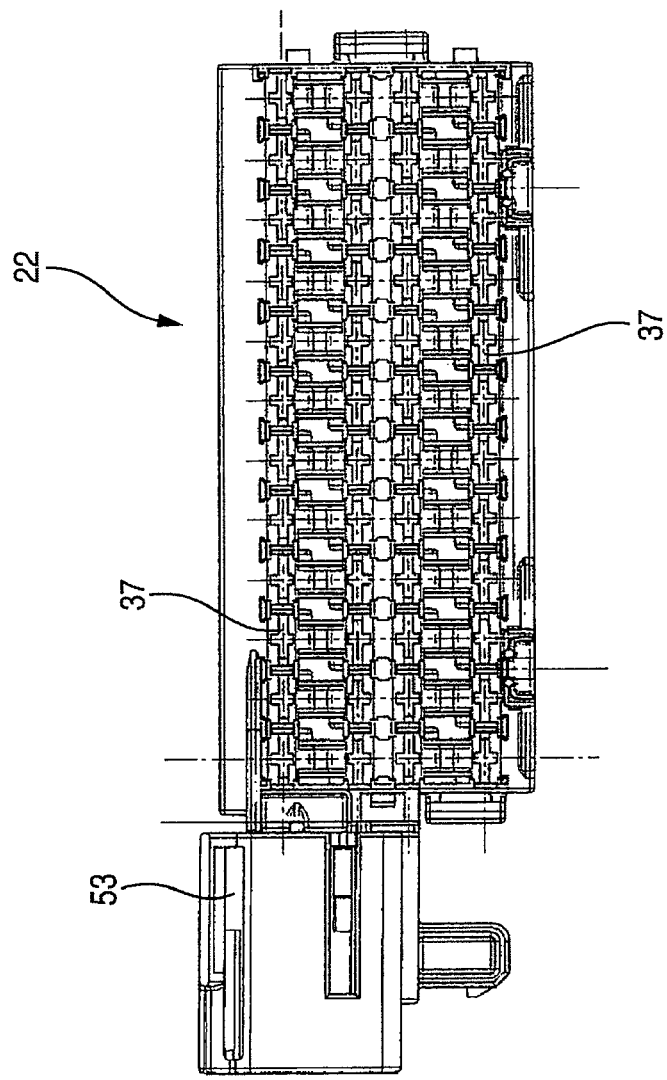
FIGS. 4A and 4B show a fuse connection box.
Figure 4B:
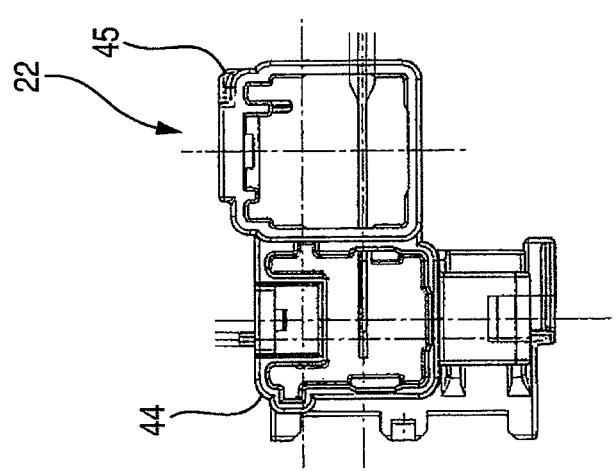
Figure 5:
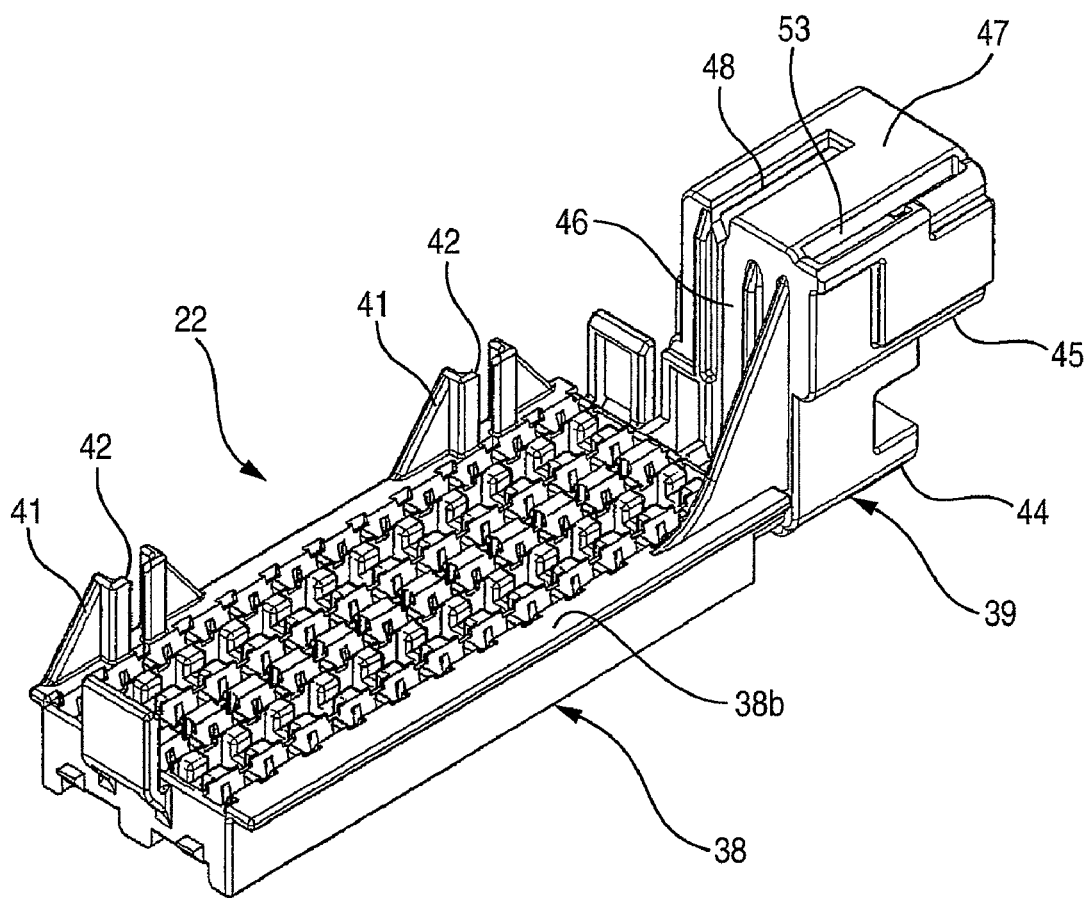
FIG. 5 is a perspective view of the fuse connection box.
Figure 6A:
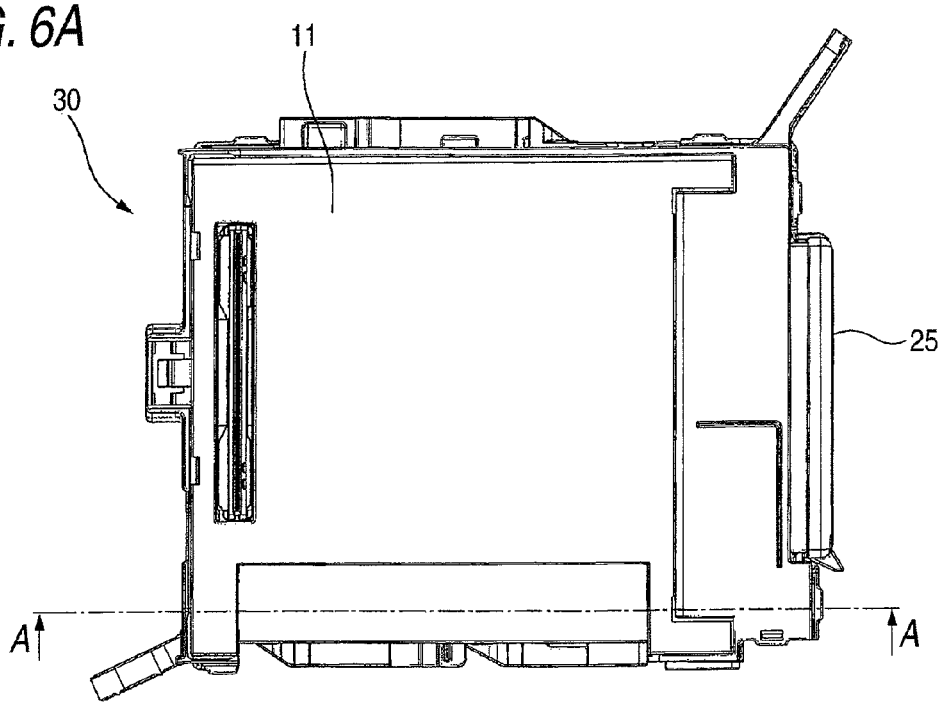
FIGS. 6A, 6B, and 6C show a connection box main body.
Figure 6B:
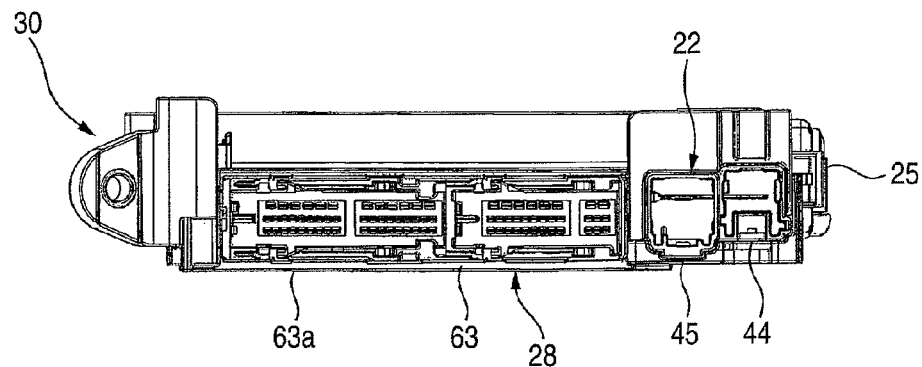
Figure 6C:
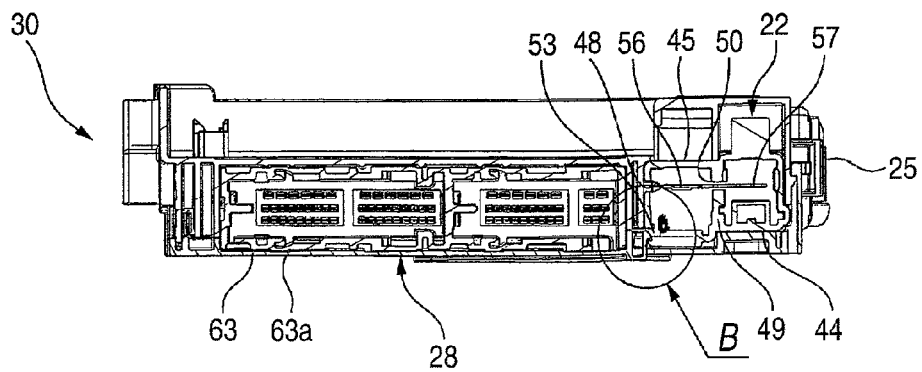
Figure 7A:
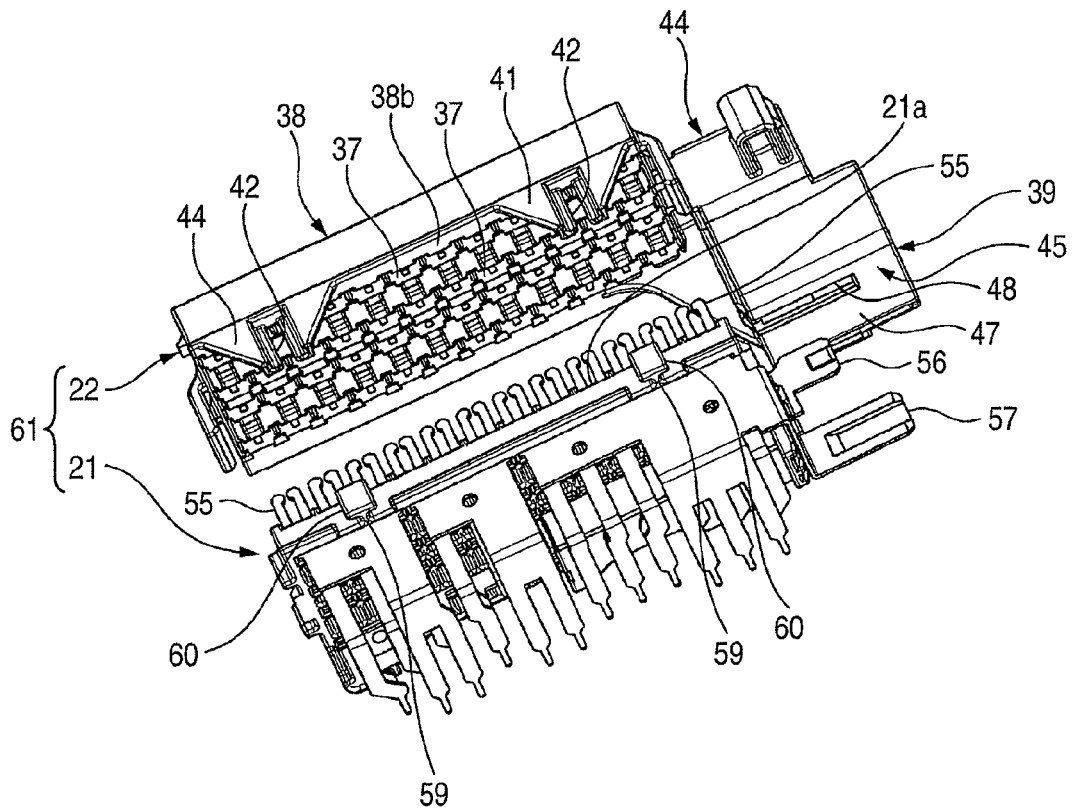
FIGS. 7A and 7B show a fuse connection box and a fuse holder.
Figure 7B:
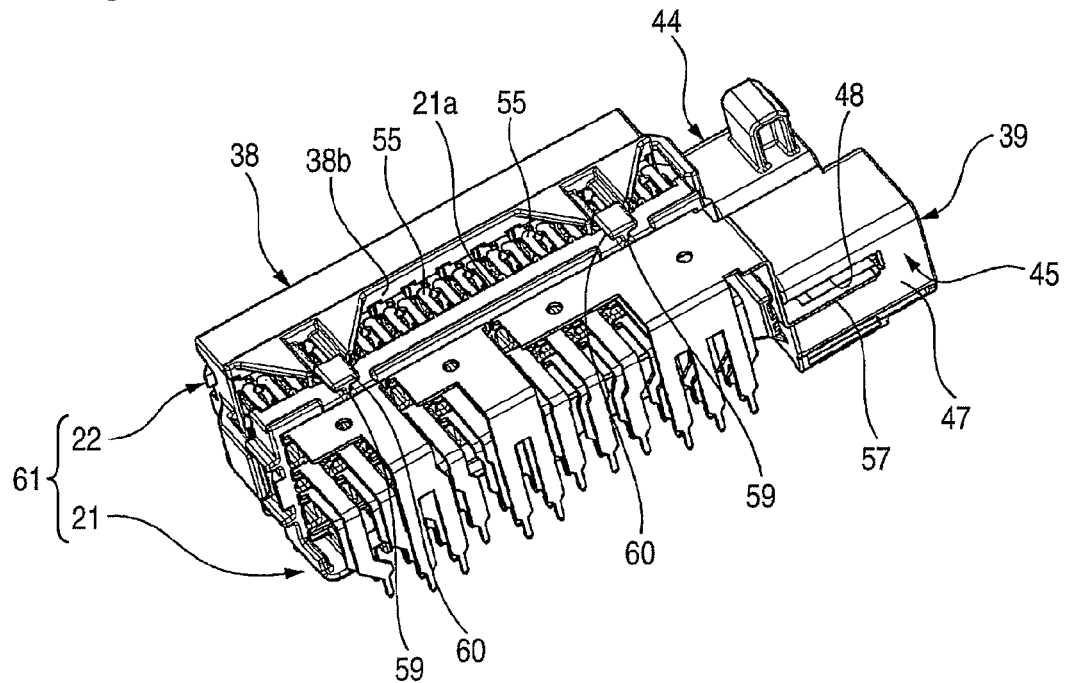
Figure 8A:
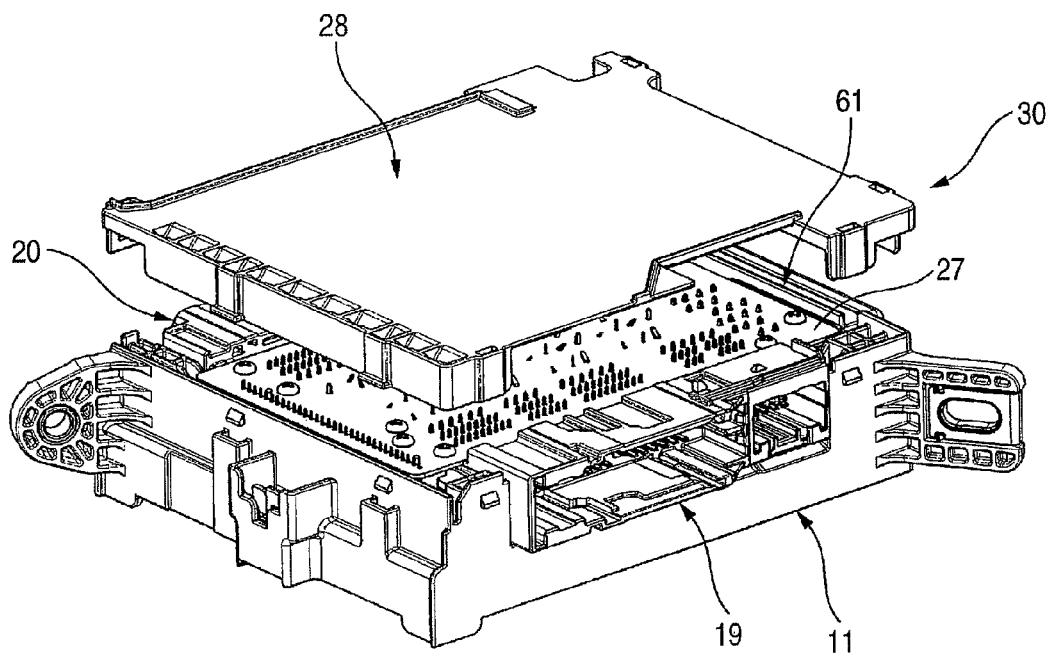
FIGS. 8A and 8B show before and after assembling an outer cover of the connection box main body.
Figure 8B:
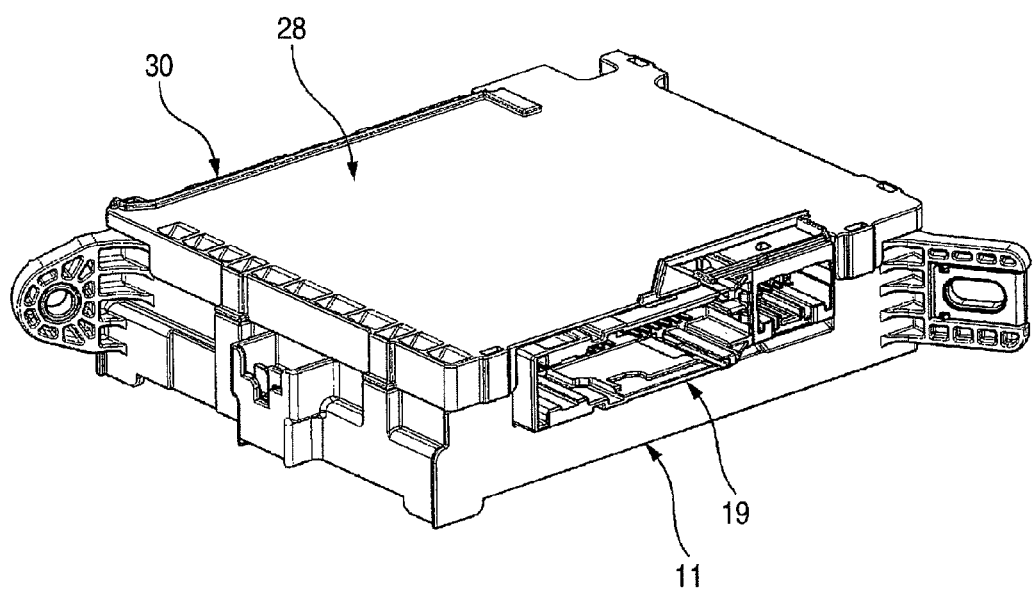
Figure 9:
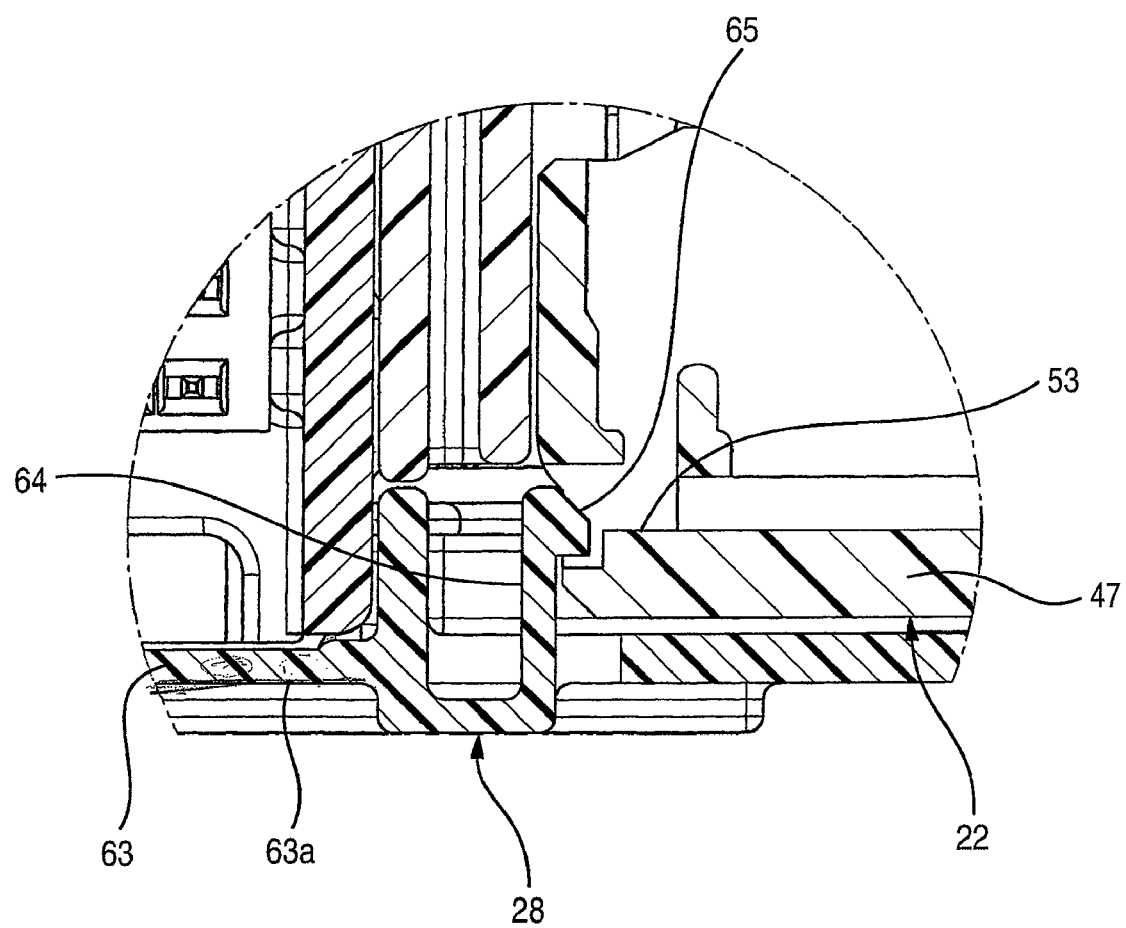
FIG. 9 is a sectional view enlarging a portion B of FIG. 6C.

FIG. 1 through FIG. 9 are views showing an electric connection box according to an embodiment of the invention, FIG. 1 is a disassembled perspective view showing a structure of an electric connection box, FIG. 2A is a perspective view before assembling an electronic control unit of an electric connection box, FIG. 2B is a perspective view after assembling the electronic control unit of the electric connection box, FIG. 3A is a plane sectional view of a fuse connection box, FIG. 3B is a front view of the fuse connection box, FIG. 3C is a bottom view of the fuse connection box, FIG. 3D is a side view of the fuse connection box, FIG. 4A is a rear view of the fuse connection box, FIG. 4 B is a side view of the fuse connection box, FIG. 5 is a perspective view of the fuse connection box, FIG. 6A is a plane view of a connection box main body, FIG. 6B is a front view of the connection box main body, FIG. 6C is a sectional view taken along a line A-A of FIG. 6A, FIG. 7A is a perspective view before assembling the fuse connection box and a fuse holder, FIG. 7B is a perspective view in the midst of assembling the fuse connection box and the fuse holder, FIG. 8A is a perspective view before assembling an outer cover of the connection box main body, FIG. 8B is a perspective view after assembling the outer cover of the connection box main body, and FIG. 9 is a sectional view enlarging a portion B of FIG. 6C.

As shown in FIG. 1 and FIG. 2A, an electric connection box 10 includes an inner cover 11, an electronic control unit 12 accommodating an electronic control unit (ECU) board (not illustrated) and an ECU box 13 made of a synthetic resin containing the ECU board and arranged in one side of the cover 11, and two electric connection parts 14, 15 arranged on the other side of the inner cover 11 and connected to the electronic control unit 12 by way of the inner cover 11.

Further, the electric connection box 10 includes two connector blocks 19, 20 mounted to be directed to be opposed to each other, a fuse holder (terminal holding member) 21 mounted in a direction orthogonal to the connector blocks 19, 20, a circuit board 27 connected with the above-described electric connection parts 14, 15, a plurality of relays 18 mounted on the circuit board 27, and an outer cover (cover) 28 covering a side opposed to the relay 18 of the circuit board 27, the connector blocks 19, and the fuse holder 21.

Further, the electric connection box 10 includes a Rise connection box (synthetic resin part, terminal inserting member) 22 arranged on an outer side of the fuse holder 21, a plurality of fuses 23 arranged at the fuse connection box 22, a fuse cover 25 attached to the fuse connection box 22 to cover the fuse 23. Further, the connector blocks 19, 20 are connected with a terminal of a wire harness, not illustrated.

As shown by FIGS. 2A and B, according to the electric connection box 10, the electronic control unit 12 is made to be able to be removed from the inner cover 11 of a connection box main body 30 excluding the electronic control unit 12. That is, the ECU box 13 of the electronic control unit 12 is attached to the connection box main body 30 by engaging a frame-like projection 33 provided at a center of other edge portion with an engaging claw portion 34 of the inner cover 11 in a state of engaging a pair of engaging projections 31 provided at both ends of one end portion with engaging recess portions 32 of the inner cover 11.

The fuse connection box 22 is constituted by a shape shown in FIG. 3 through FIG. 5 and includes a fuse connection blocks 38 substantially in a shape of a parallelepiped formed with a plurality of inserting grooves 37 inserted with the plurality of fuses 23 and fusible links (not shown) in an aligned state to penetrate from a side of a front face 38a to a side of a rear face 38b, and a harness connection block 39 projected from one end portion in a longitudinal direction of the fuse connection block 38 in a direction orthogonal to the rear face 38b.

Further, the fuse connection box 22 is formed with a plurality of guide portions (plate-like portion) 41 projected to be orthogonal to the rear face 38b along an end edge portion of a long side of the rear face 38b of the fuse connection block 38, and the guide portions 41 are formed with guide grooves (projected streak guide grooves) 42 extended to be orthogonal to the rear face 38b. The guide grooves 42 run through front end sides in projecting directions of the guide portions 41.

The harness connection block 39 includes connection openings 44, 45 at two locations which constitute a shape of a bottomed cylinder along a longitudinal direction of the fuse connection block 38 and portions of which are made to common to each other. The connection openings 44, 45 are aligned along a direction in which the harness connection blocks 39 is projected from the fuse connection box 22.

The connection opening 45 positioned remote from the fuse connection block 38 is connected with a wire harness for a power source, not illustrated, as shown by FIG. 5, the connection opening 45 is formed with a guide groove (terminal guide groove) 48 in an L-like shape from a bottom plate portion 46 over to a side plate portion 47 opposed to the fuse connection block 38 at a vicinity of an end edge portion on a side of being proximate to the guide portion 41 of the fuse connection block 38.

A total of the guide groove 48 is arranged in a plane along the longitudinal direction of the fuse connection block 38 orthogonal to the rear face 38b. Further, as shown by FIG. 3 and FIG. 6C, also a side plate portion 49 common to the connection opening portions 44, 45 is formed with a guide groove (terminal guide groove) 50 at inside of the plane.

Further, as shown by FIG. 5, the above-described side plate portion 49 of the connection opening 45 is formed with a mold stripping hole 53 for molding in parallel with the above-described guide groove 48 at a vicinity of an end edge portion constituting a side of being remote from the guide portion 41 of the fuse connection block 38.

That is, the fuse connection box 22 includes a synthetic resin material and integrally molded to the above-described shape by injection molding and the mold stripping hole 53 is formed for drawing the mold in the integral molding.

As shown by FIGS. 7A and 7B, the fuse holder 21 is made to constitute substantially a shape of a parallelepiped, and a front face 21a thereof is projected with a plurality of connection terminals 55 constituted by tuning fork terminals orthogonal to the front face 21a in an aligned state. Further, the fuse holder 21 is projected with a pair of power source terminals 56, 57 at a side portion on one end side (that is, one side of side of short side) in a longitudinal direction.

The power source terminals 56, 57 are in line with a direction of aligning the plurality of connection terminals 55 and arranged on the same plane along the longitudinal direction of the fuse holder 21 and orthogonal to the front face 21a.

Further, the fuse holder 21 has a plurality of guide projected streaks 59 extended to be orthogonal to the front face 21a and sides of projected front ends of the guide projected streaks 59 are formed with a front end portion 60 which width is larger than a bottom portion of the guide projected streaks 59. The guide projected streaks 59 are extended along a direction in which the connection terminal 55 is projected.

Further, when the fuse holder 21 is integrated to the fuse connection box 22, as shown in FIGS. 7A and 7B, first, in a state of making the rear face 38b of the fuse connection block 38 of the fuse connection box 22 and the front face 21a of the fuse holder 21 opposed to each other, the rear face 38b and the front face 21a are made to be proximate to each other. At this time, first, the power source terminals 56, 57 of the fuse holder 21 are inserted to the guide grooves 48, 50 of the fuse connection block 38.

At this time, the power source terminals 56, 57 in the shape of the flat plate are positioned in a direction orthogonal to faces thereof by being guided by the guide groove 48 and the guide groove 50 in the L-like shape, and the fuse holder 21 is positioned relative to the fuse connection box 22 in the direction.

Next, the plurality of guide projected streaks 59 of the fuse holder 21 are inserted to the plurality of guide grooves 42 of the fuse connection block 38 in a one to one relationship. Thereby, the fuse holder 21 is positioned relative to the fuse connection box 22 in a direction of aligning the plurality of guide projected streaks 59, that is, in longitudinal directions of the fuse connection block 38 and the fuse holder 21.

As a result of the above-described process, the fuse holder 21 is positioned relative to the fuse connection box 22 in a direction other than the direction of inserting the plurality of connection terminals 55 to the plurality of inserting grooves 37 and a relative movement in the direction is regulated. Further, the guide portion 41 having the guide groove 42 is constituted by the plate-like shape and is positioned further by the front end portion 60 with a large width formed at the guide projected streak 59.

Further, when the fuse holder 21 is further made to be proximate to the fuse connection box 22 in a state of being positioned in the direction other than the inserting direction in this way, the plurality of connection terminals 55 are inserted to the plurality of inserting grooves 37 in the one to one relationship, the fuse holder 21 is integrated to the fuse connection box 22, and a fusible link block 61 is formed. Further, the plurality of connection terminals 55 are attachably and detachably connected with the plurality of fuses 23 shown in FIG. 1 and the fusible links (not shown) from an outer side of the fuse connection box 22.

As shown by FIGS. 8A and B, the outer cover 28 is attached to the inner cover 11 in a state of being preliminarily attached with the connector blocks 19, 20, the fusible link block 61 and the circuit board 27 and the like.

Here, as shown by FIG. 6C and FIG. 9, the fuse connection box 22 of the fusible link block 61 attached to the inner cover 11 has the mold stripping hole 53 to be recessed in a direction along an outer surface 63a of a main plate portion 63 of the outer cover 28 attached to the fuse connection box 22 (that is, formed to be extended in a direction in parallel with the outer surface 63a) on an inner side of the electric connection box 10.

The outer cover 28 has a projected piece portion 64 projected from the main plate portion 63 having the outer surface 63a to an inner side along a direction orthogonal to the outer surface 63a, and a engaging portion 65 is formed at a tip of the projected piece portion 64 so as to be orthogonal to the projected piece portion 64.

Thereby, the engaging portion 65 is disposed on an inner side of the outer surface 63a. The engaging portion 65 is projected in direction along the outer surface 63a and engaged with the mold stripping hole 53 positioned in front of the projecting direction of the engaging portion 65. Thus, the outer cover 28 is engaged with the fuse connection box 22.

In this way, according to the electric connection box 10 according to the embodiment, when the plurality of connection terminals 55 of the fuse holder 21 are inserted to the plurality of inserting grooves 37 of the fuse connection box 22, the power source terminals 56, 57 at one side portion of the fuse holder 21 can be guided by the guide grooves 48, 50 of the fuse connection box 22, and the guide projected streak 59 at other side portion of the fuse holder 21 can be guided by the guide groove 42 of the fuse connection box 22.

Thereby, the plurality of connection terminals 55 of the fuse holder 21 can be inserted to the plurality of inserting grooves 37 of the fuse connection box 22 while being positioned, as a result, a deformation of the connection terminal 55 can be prevented.

Further, when the guide projected streak 59 of the fuse holder 21 is guided by the guide groove 42 of the fuse connection box 22, the guide portion 41 in the plate-like shape of the fuse connection box 22 is inserted between the side portion of the fuse holder 21 and the front end portion 60 on a side of the projected front end of the guide projected streak 59.

Thereby, the plurality of connection terminals 55 of the fuse holder 21 can be inserted to the plurality of inserting grooves 37 of the fuse connection box 22 while being further accurately positioned, as a result, the deformation of the connection terminal 55 can be surely prevented.

Further, by preventing the deformation of the connection terminal 55, a failure in connecting the fuse 23 and the fusible link 24 can be prevented.

Further, the invention is not limited to the above-described embodiment but can pertinently be modified, improved or the like. Otherwise, materials, shapes, dimensions, numerical values, modes, numbers, arranging portions and the like of respective constituent elements in the above-described embodiment are arbitrary and not limited so far as the invention can be achieved.

What is claimed is:

1. An electric connection box comprising:
   a terminal holding member having a front surface, a first side surface, and a second side surface, and including a plurality of terminals mounted on the front surface so as to be projected from the front surface, an source terminal mounted on the first side surface so as to be projected from the first side surface in a direction in which the terminals align, and a guide projected streak mounted on the second side surface along a direction in which the terminals are projected so as to be projected from the second side surface; and
   a terminal inserting member including a plurality of inserting grooves in which the terminals are inserted, a terminal guide groove in which the source terminal is inserted, and a streak guide groove in which the guide projected streak is inserted.

2. The electric connection box according to claim 1, wherein a width of the front end portion of the guide projected streak is larger than the width of the bottom portion of the guide projected streak; and the terminal inserting member includes a guide portion with plate shape on which the streak guide groove is formed.

3. The electric connection box according to claim 1, wherein the terminals are connected with a fuse.

* * * * *